(12) United States Patent
Kobayashi et al.

(10) Patent No.: US 6,420,787 B1
(45) Date of Patent: Jul. 16, 2002

(54) SEMICONDUCTOR DEVICE AND PROCESS OF PRODUCING SAME

(75) Inventors: Tsuyoshi Kobayashi; Mitsutoshi Higashi; Hiroko Koike; Kei Murayama; Hideaki Sakaguchi, all of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 32 days.

(21) Appl. No.: 09/591,785

(22) Filed: Jun. 12, 2000

(30) Foreign Application Priority Data

Jun. 21, 1999 (JP) ............................................ 11-174670

(51) Int. Cl.[7] .............................................. H01L 23/48
(52) U.S. Cl. ..................... 257/777; 257/778; 257/784; 257/779; 257/780; 257/786; 257/723; 257/724
(58) Field of Search .............................. 257/777, 778, 257/779, 780, 784, 786, 723, 724

(56) References Cited

U.S. PATENT DOCUMENTS 5,767,564 A * 6/1998 Kunimatsu et al. ......... 257/532

6,110,823 A * 8/2000 Eldridge et al. ............ 438/660

FOREIGN PATENT DOCUMENTS

| JP | A-61-73341 | 5/1986 |
| JP | A-1-137662 | 5/1989 |
| JP | A-6-151701 | 4/1994 |

* cited by examiner

Primary Examiner—David L. Talbott
Assistant Examiner—Luan Thai
(74) Attorney, Agent, or Firm—Pennie & Edmonds LLP

(57) ABSTRACT

A semiconductor device having a first electronic part and a second electronic part, the first electronic part being larger than the second electronic part in area and in the number of connection terminal pads including pad form electrode terminals, and external connection terminals or other connection terminals bonded to the connection terminal pads, wherein the first and second electronic parts are disposed one upon the other with respective pad forming surfaces facing each other and are electrically connected to each other by flip-chip bonding; and springy wire form connection terminals stand on, and are bonded to, the connection terminal pads of the first electronic part other than those electrically connected to the connection terminal pads of the second electronic part.

11 Claims, 11 Drawing Sheets

Fig. 4
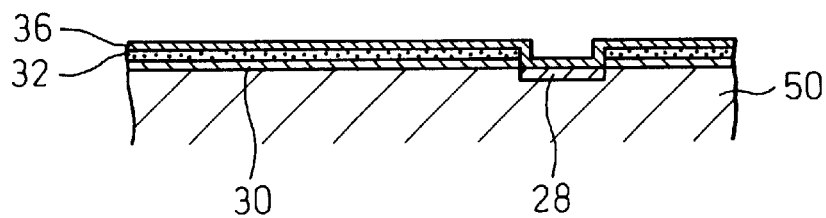
(a)
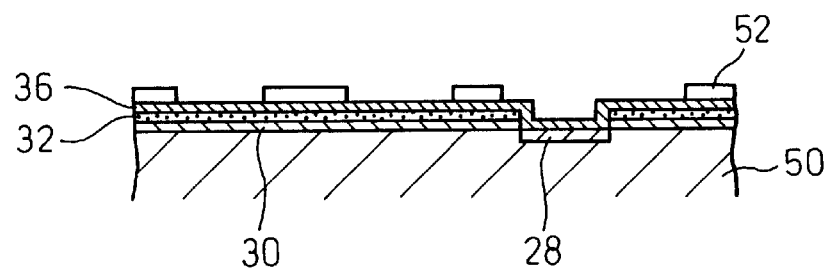
(b)
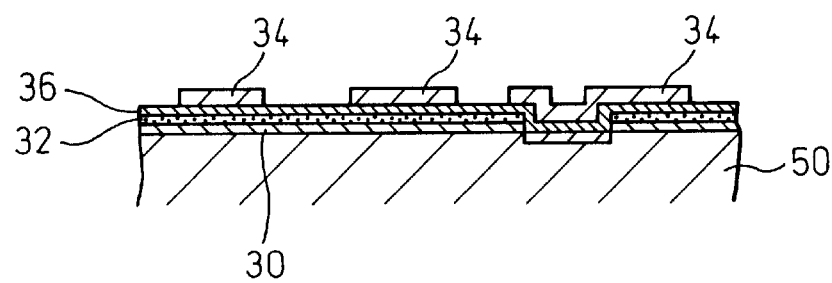
(c)
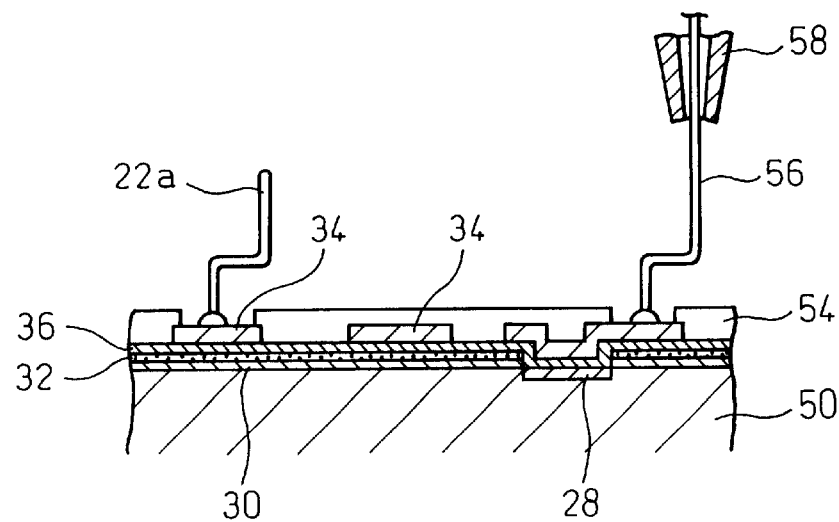
(d)

Fig.5
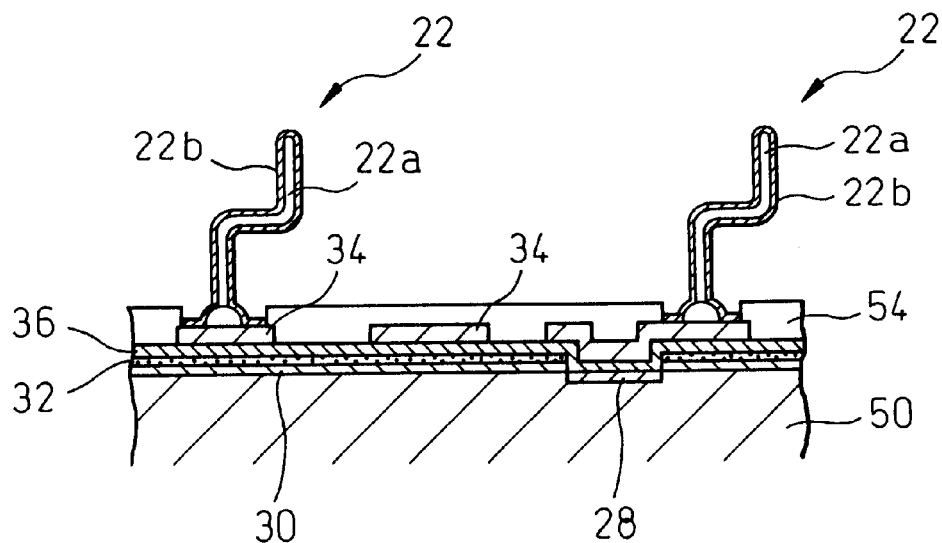
(a)
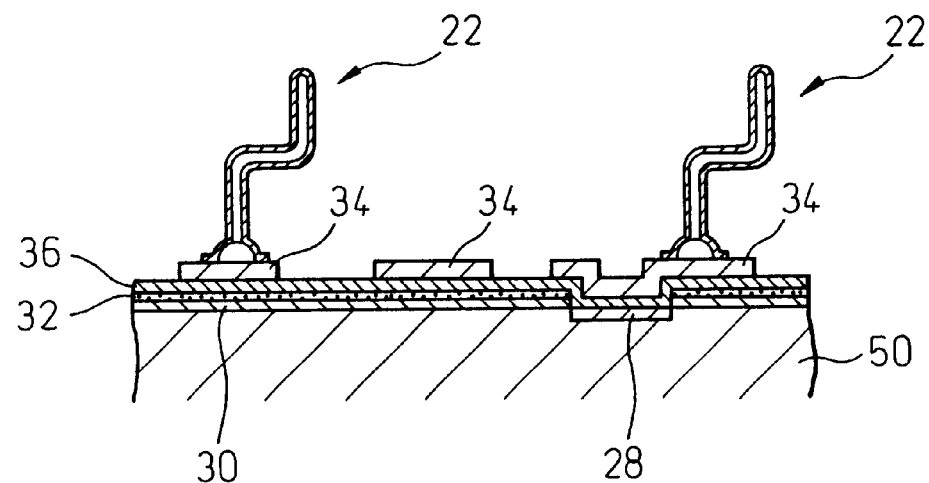
(b)

Fig. 10
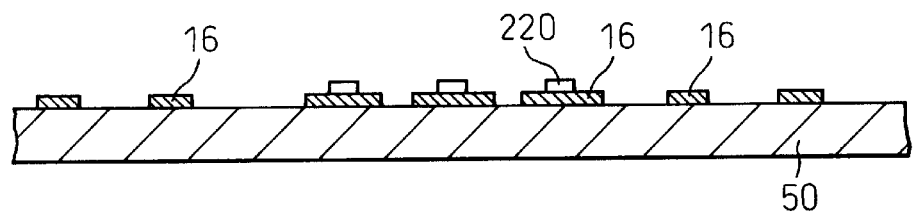
(a)
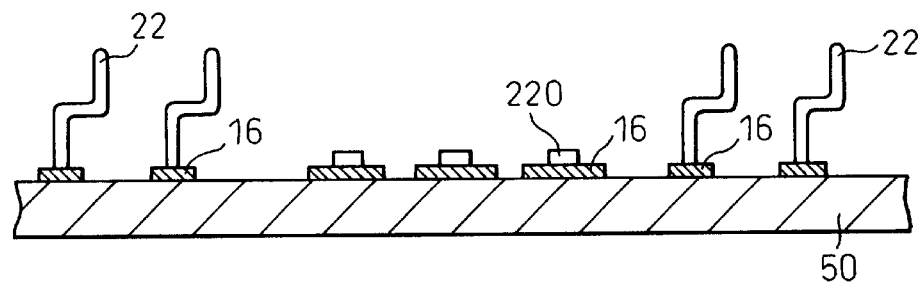
(b)
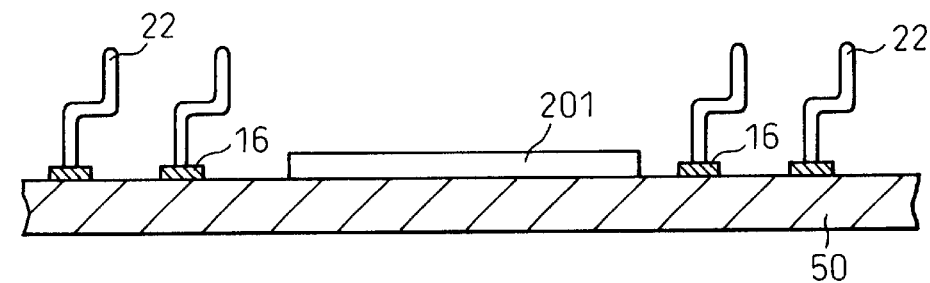
(c)
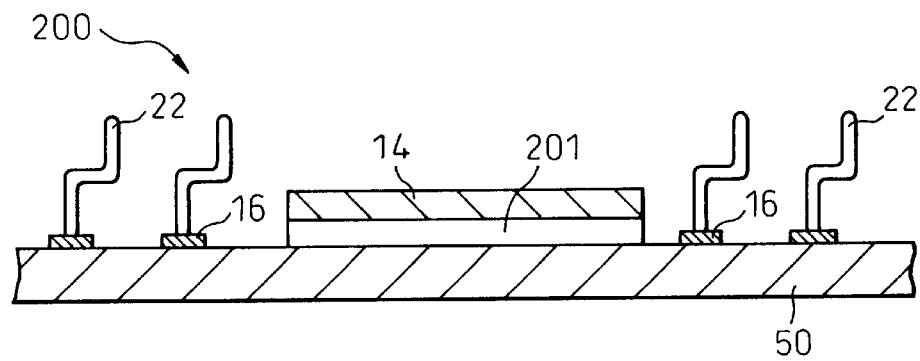
(d)

Fig.13
(a) 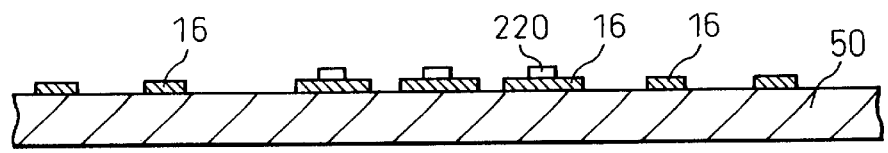
(b) 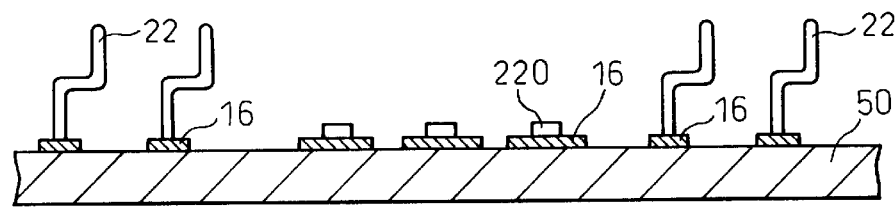
(c) 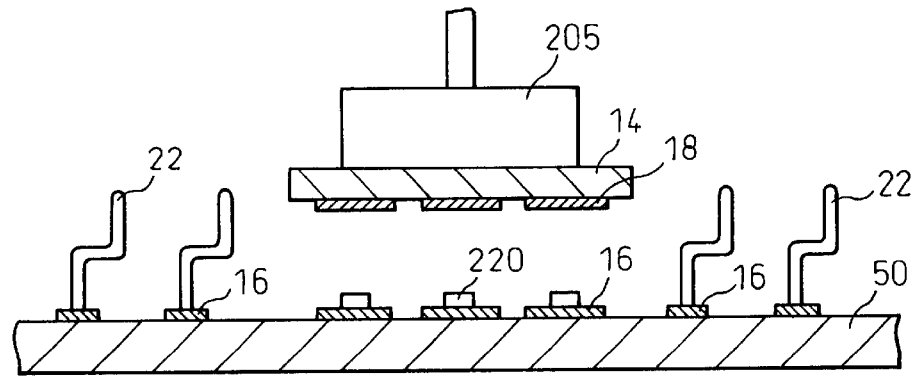
(d) 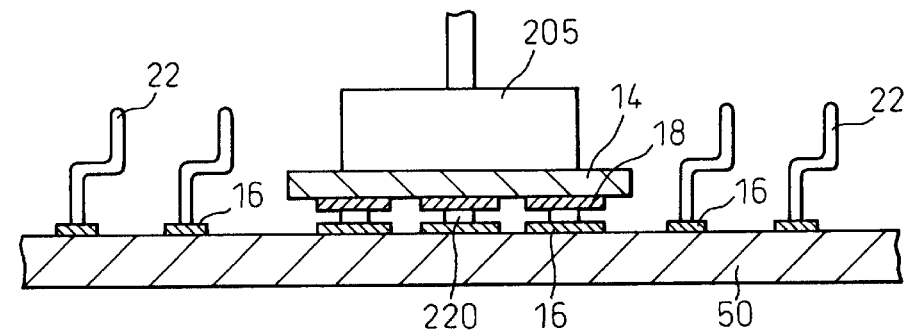
(e) 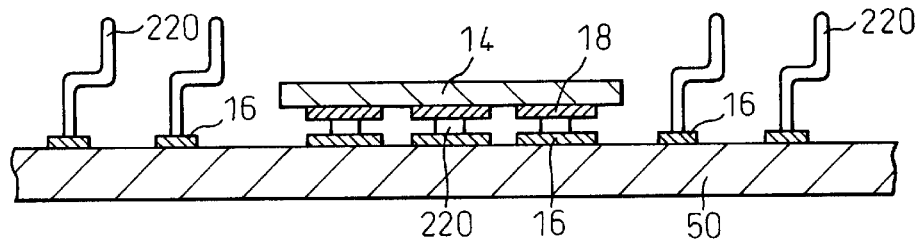

SEMICONDUCTOR DEVICE AND PROCESS OF PRODUCING SAME

BACKGROUND OF THE INVENTION

1. Field of the Invention

The present invention relates to a semiconductor device and a process of producing the same, and particularly, to a semiconductor device having a first electronic part and a second electronic part, the first electronic part being larger than the second electronic part in area and in the number of connection terminal pads including pad-form electrode terminals, the first and second electronic parts being disposed one upon the other with the respective pad forming surfaces facing each other, and the external connection terminals or other connection terminals being bonded to the connection terminal pads, and a process of producing the same.

2. Description of the Related Art

FIG. 16 shows a semiconductor device 100, having two semiconductor chips 102 and 104 disposed one upon the other, which has been recently brought into practical use. The semiconductor chip 102 having a smaller area is mounted on, and bonded to, one side of the semiconductor chip 104 having a larger area.

The smaller semiconductor chip 102 has one side, or an electrode terminal forming surface, provided with electrode terminals 112 formed thereon and electrically connected, via conductor wires 110, to connection pads 108 formed on a substrate 106 and has another side, or a surface which is opposite to the electrode terminal forming surface and is bonded to one side of the larger semiconductor chip 104.

The larger semiconductor chip 104 has one side bonded to the smaller semiconductor chip 102 and provided with electrode terminals 114 formed thereon and electrically connected, via conductor wires 110, to connection pads 108 formed on the substrate 106 and has another side bonded to one side of the substrate 106 on which side connection pads 108 are formed.

The substrate 106 has the other side provided with external connection terminals or bumps 116 to be connected to connection pads of a motherboard.

The device 100 having the semiconductor chips 102 and 104 on the substrate is sealed or packaged with a sealing or packaging resin 118 to form a package.

The semiconductor device 100 shown in FIG. 16 advantageously provides an electronic system having an improved operating speed and performance in comparison with a system assembled of separate semiconductor packages having respective semiconductor chips 102 and 104, because not only is the delay of the signal transfer between chips 102 and 104 significantly mitigated but also the influence of the capacitance and inductance throughout the system is suppressed.

However, the conventional semiconductor device 100 has a drawback that electrode terminals cannot be formed on the surfaces of the chips 102 and 104 in the portion for bonding the chips to each other, so that the chip 104 must have a portion on which electrode terminals are disposed in the surface bonded to the chip 102 for bonding the conductor wires 110.

Furthermore, to mount a chip capacitor or other passive element on the semiconductor chip 104, an area therefor must be also provided in the surface bonded to the chip 102.

Therefore, miniaturization of the semiconductor chip 104 has an unavoidable limit.

Moreover, the presence of the substrate 106 makes it difficult to reduce the thickness of the device. 100 as a whole.

There is also a drawback that it is difficult to transfer an assembly of the chips 102 and 104 by vacuum adsorption or other usual transfer means and handling in the production process is complicated, because of the presence of the electrode terminals 112 and 114 exposed from the upper surfaces of the chips 102 and 104.

SUMMARY OF THE INVENTION

The object of the present invention is to provide a semiconductor device having a first electronic part and a second electronic part, the first electronic part being larger than the second electronic part in area and in the number of connection terminal pads including pad form electrode terminals, the first and second electronic parts being disposed one upon the other with respective pad forming surfaces facing each other, and external connection terminals or other connection terminals being bonded to the connection terminal pads, and a process of producing the same, in which the semiconductor device can be easily miniaturized and reduced in thickness.

To achieve the object according to the present invention, there is provided a semiconductor device having a first electronic part and a second electronic part, the first electronic part being larger than the second electronic part in area and in the number of connection terminal pads including pad form electrode terminals, and external connection terminals or other connection terminals being bonded to the connection terminal pads, wherein:

the first and second electronic parts are disposed one upon the other with respective pad forming surfaces facing each other and are electrically connected to each other by flip-chip bonding; and springy wire-form connection terminals stand on, and are bonded to, the connection terminal pads of the first electronic part other than those electrically connected to the connection terminal pads of the second electronic part.

Because the first and second electronic parts are flip-chip bonded to each other, neither conductor wires nor connection pads therefor are necessary for electrical connection between the two parts, so that the delay of the signal transfer is minimized and so that the first electronic part larger in area need not have a portion on which electrode terminals are disposed in the surface bonded to the second electronic part, for bonding the conductor wires, and therefore, the degree of freedom in designing the electronic parts is increased.

The springy wire-form connection terminals allow the semiconductor device to be directly mounted on, and electrically connected to, a motherboard without an intervening substrate conventionally used, thereby enabling the thickness of the semiconductor device to be reduced.

The springy nature of the wire-form connection terminals also advantageously prevents occurrence of a thermal stress which would otherwise occur because of a difference in thermal expansion coefficient between the semiconductor device and the motherboard, or conventionally between the first electronic part and the substrate.

In a preferred embodiment, the second electronic part includes a semiconductor chip to provide a minimized delay in the signal transfer between the semiconductor chips of the first and second electronic parts.

In another preferred embodiment, the first electronic part is a chip size package having substantially the same size as that of a semiconductor chip mounted thereon and/or the second electronic part is either a bare chip having electrode terminals in a pad form or a chip size package having substantially the same size as that of a semiconductor chip mounted thereon. This further facilitates miniaturization of the semiconductor device.

In another preferred embodiment, the connection terminal pads are electrically connected to electrode terminals of a semiconductor chip through extension wiring formed on an electrode terminal forming surface of the semiconductor chip to allow the connection terminal pads to be disposed entirely over the electrode terminal forming surface.

In another preferred embodiment, the connection terminal pads are composed of two layers of different metals etchable with different etchants to enable the connection terminal pads for external connection to be formed by electrolytic plating and etching.

In another preferred embodiment, the springy wire-form connection terminals are composed of a bent wire of gold or other metal having a metal coating plated thereon to provide reinforced springy wire-form connection terminals.

The present invention also advantageously ensures miniaturization and reduction in thickness of the semiconductor device, when the second electronic part is a passive element such as a chip capacitor or a chip resistor having electrode terminals electrically connected to the connection terminal pads of the first electronic part.

According to the present invention, there is also provided a process of producing a semiconductor device having a first electronic part and a second electronic part, the first electronic part being larger than the second electronic part in area and in number of connection terminal pads including pad form electrode terminals, the first and second electronic parts being disposed one upon the other with respective pad forming surfaces facing each other, the first and second electronic parts being electrically connected to each other by flip-chip bonding, and external connection terminals or other connection terminals bonded to the connection terminal pads, the process comprising the steps of:

providing a wafer having a plurality of chip size packages formed therein as the first electronic parts, the chip size packages having substantially the same size as that of a semiconductor chip mounted thereon;

electrically connecting the first electronic parts with the second electronic parts by flip-chip bonding; and cutting the wafer to separate the chip size packages from each other, each of the chip size packages having the second electronic part flip-chip bonded thereto.

The process also provides a minimized delay in the signal transfer between the semiconductor chips of the first and second electronic parts of the semiconductor device in various embodiments as follows.

In one embodiment, the second electric part is a bare chip having pad form electrode terminals as connection terminal pads.

In another embodiment, the second electric parts are also chip size packages having substantially the same size as that of a semiconductor chip mounted thereon, and the first and second electronic parts are electrically connected by bonding the connection terminal pads thereof via connection terminals formed on the connection terminal pads of one of the first and second electronic parts.

In another embodiment, prior to the step of electrically connecting the first and second electronic parts by flip-chip bonding, the process further comprises the step of electrically connecting the connection terminal pads to electrode terminals of a semiconductor chip mounted on a chip size package formed in the wafer, through an extension wiring formed on an electrode terminal forming surface of the semiconductor chip. This allows the connection terminal pads to be disposed in a desired portion on one side of the chip size package, which is typically formed as the first electronic part.

In another preferred embodiment, prior to the step of electrically connecting the first and second electronic parts by flip-chip bonding, the process further comprises the step of:

bonding bent wires of gold or other metal to the connection terminal pads in a selected portion of the first electronic parts formed in the wafer;

plating the bent wires to form a metal layer thereon to provide springy wire form external connection terminals standing on the connection terminal pads; and electrically connecting the second electronic part to the connection terminal pads in a portion other than the selected portion of the first electronic part.

This facilitates miniaturization and a reduction in thickness of the semiconductor device of the present invention.

In another preferred embodiment, the connection terminal pads composed of two layers of different metals etchable with different etchants can be easily formed by the steps of forming a first metal layer on a wafer to entirely cover a pad forming surface of the wafer, forming on the first metal layer a second metal layer having a selected pattern and etchable with an etchant different from an etchant which etches the first metal layer by electrolytic plating using the first metal layer as a plating current supply layer, and removing the first metal layer in a portion not covered with the second metal layer by etching.

The present invention also facilitates handling of an assembly of the first and second electronic parts in the production process, because the first and second electronic parts are flip-chip bonded to each other to provide the assembly with a smooth upper surface suited to vacuum adsorption or other usual transfer means.

The present inventive process is also advantageous because a plurality of chip size packages are formed in a wafer having a high degree of flatness which enables high precision forming of connection pads, etc. of the respective chip size packages and because the second electronic parts are flip-chip bonded to the respective chip size packages on the wafer to facilitate precise positioning and bonding of the second electronic parts with respect to the chip size packages.

BRIEF DESCRIPTION OF THE DRAWINGS

FIG. 4 is a cross-sectional view showing a process of producing a semiconductor device shown in FIGS. 1 to 3, according to a preferred embodiment of the present invention;

FIG. 5 is a cross-sectional view showing a process of forming a springy wire form connection terminals coated with a hard metal case according to the present invention;

FIG. 10 is a cross-sectional view showing a process of producing a semiconductor device according to a fifth embodiment of the present invention;

FIG. 13 is a cross-sectional view showing a process of producing a semiconductor device according to a seventh embodiment of the present invention;

DESCRIPTION OF THE PREFERRED EMBODIMENTS

Figure 1:
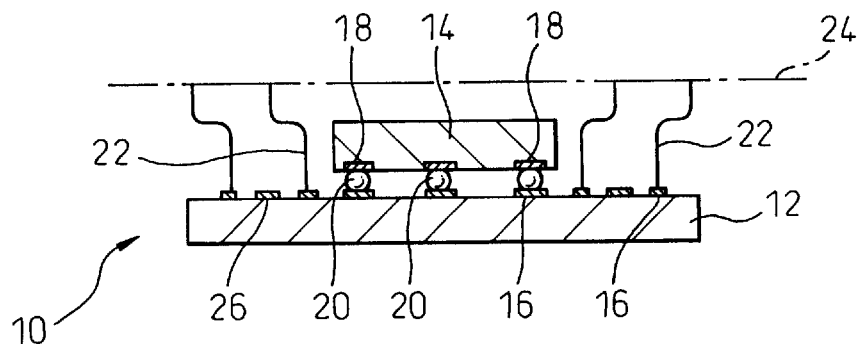
FIG. 1 is a cross sectional view of a semiconductor device including a bare chip (BC) mounted on a chip size package (CSP) and springy wire form connection terminals having one end bonded to the CSP and the other end bonded to a motherboard, according to a preferred embodiment of the present invention.

FIG. 1 is a vertical cross-sectional view of a semiconductor device according to an embodiment of the present invention. The semiconductor device 10 has a first electronic part 12 and a second electronic part 14, in which the first electronic part 12 is larger than the second electronic part 14 in area and in the number of connection terminal pads including pad form electrode terminals. The first electronic part 12 is a chip size package having substantially the same size as a semiconductor chip mounted thereon (not shown) and the second electronic part 14 is a bare chip having pad form electrode terminals as a connection terminal pad.

The chip size package (CSP) 12 and the bare chip (BC) 14 are disposed in a mutual positional relationship such that connection terminals pads 16 of the CSP 12 are facing pad form electrode terminals 18 of the BC 14.

The CSP 12 and the BC 14 are electrically connected to each other by flip-chip bonding in a manner such that the electrode terminals 18 of the BC 14 have connection terminals or solder balls 20 bonded thereto and to the corresponding connection terminal pads 16 of the CSP 12.

Springy wire form connection terminals 22 stand on, and are bonded to, the connection terminal pads 16 of the CSP 12 other than those electrically connected, via the solder balls 20, to the connection terminal pads or pad form electrode terminals 18 of the BC 14. The springy wire form connection terminals 22 form external connection terminals to be connected to connection pads (not shown) of a motherboard 24.

Figure 2:
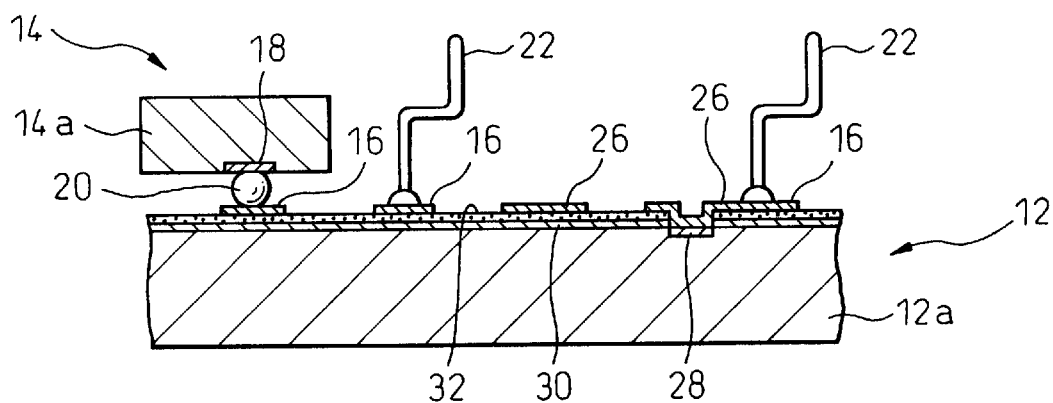
FIG. 2 is an enlarged partial cross-sectional view of the semiconductor device shown in FIG. 1.

FIG. 2 is an enlarged partial cross-sectional view of the semiconductor device 10 shown in FIG. 1. The CSP 12 includes a semiconductor chip 12a having an active surface provided with electrode terminals 28 formed thereon. The active surface is coated with a passivation film 30 further coated with a resin layer 32 of polyimide resin, in an area other than the electrode terminals 28.

The connection terminal pads 16 are formed on the resin layer 32 and are electrically connected to the electrode terminals 28 through extension wiring 26 formed on the resin layer 32. Some of the connection terminal pads 16 are bonded to the connection terminals or solder balls 20 bonded to the BC 14 and the remaining connection terminal pads 16 have springy wire form connection terminals 22 standing thereon and bonded thereto.

The BC 14 includes a semiconductor chip 14a having pad form electrode terminals 18 which also serve as connection terminal pads to which the solder balls 20 are bonded.

The wire form connection terminals 22 are suitably bent to exhibit a spring property and have an upper end protruding above the BC 14 to enable connection to the motherboard 24.

The electrode terminals 18 of the BC 14 are thus electrically connected to the electrode terminals 28 of the CSP 12 and/or the springy wire form connection terminals 22 through the extension wiring 26 of the CSP 12.

Figure 3:
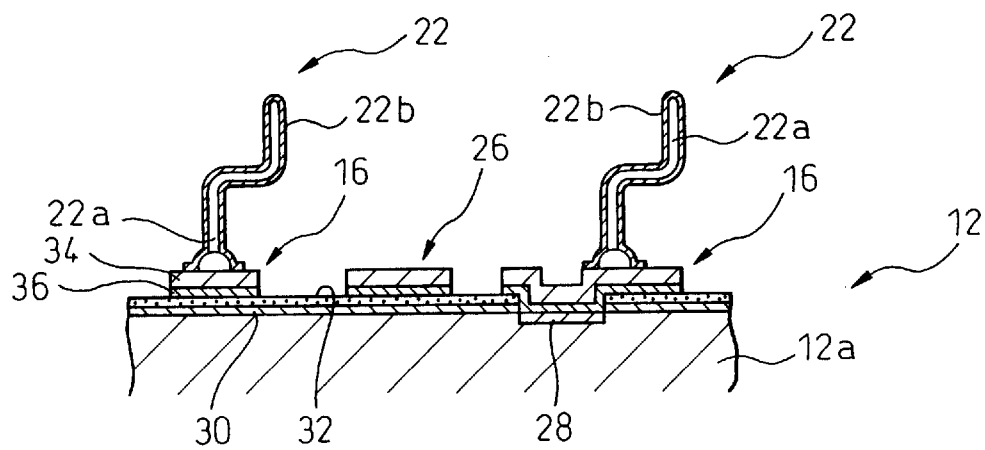
FIG. 3 is a further enlarged partial cross-sectional view of the semiconductor device shown in FIGS. 1 and 2.

As shown in FIG. 3, the wire form connection terminals 22 is preferably made of a bent core wire 22a of gold having a metal coating of a nickel-cobalt (Ni—Co) alloy plated thereon to provide a reinforced wire exhibiting the spring property.

Both the connection terminal pad 16 and the extension wiring 26 are composed of two metal layers 34 and 36 of different metals which can be etched with different etchants, i.e., the upper layer 34 is made of copper (Cu) having good electric conductivity and the lower layer 36 lying under, and thinner than, the upper layer 34 is made of chromium (Cr) not etched with an etchant which etches copper (Cu). When the upper Cu layer 34 is patterned by etching, the lower Cr layer 36 is maintained unetched to provide a current supply layer for electrolytic plating effected after the etching of the upper Cu layer 34.

The CSP 12 and the BC 14 are flip-chip bonded to each other and no wire bonding thereof is necessary for electrical connection therebetween, so that the CSP 12 need not have an additional area for connection pads for the wire bonding, thereby providing an increased degree of freedom in designing the CSP 12 and the BC 14.

The CSP 12 is larger in area and in the number of the connection terminal pads than the BC 14. The springy wire form connection terminals 22 stand on, and are bonded to, the connection terminal pads 16 of the CSP 12 except for the connection terminal pads 16 used for flip-chip bonding to the BC 14.

The provision of the springy wire form connection terminals 22 enables the present inventive semiconductor device 10 to be directly mounted on the motherboard 24 without inclusion of the substrate 106 of the conventional semiconductor device 100 shown in FIG. G10, so that the semiconductor device 10 can be reduced in thickness.

The springy wire form connection terminals 22 are also advantageously elastically deformable to absorb a thermal stress which would otherwise be generated by a difference in thermal expansion coefficient between the semiconductor device 10 and the motherboard 24.

The wire form connection terminals 22 are preferably not resin-sealed or packaged, to ensure the spring property thereof.

In the process according to the present invention, a plurality of CSPs 12 are collectively formed in a single wafer, a plurality of BCs 14 are flip-chip bonded to the CSPs 12 on the wafer, respectively, and the wafer is then cut to separate CSPs 12 together with the BCs 14 bonded thereto, to produce a plurality of a semiconductor devices each including an assembly of a CSP 12 and a BC 14 flip-chip bonded to each other.

The present invention thus ensures extremely precise formation of the connection terminal pads or other members of the semiconductor device by the formation of a plurality of CSPs 12 in a single wafer.

A plurality of CSPs 12 are formed in a single wafer through the process steps shown in FIGS. 4 and 5.

Referring to FIG. 4(a), polyimide resin is first applied to a wafer 50 to entirely cover the wafer 50 except for pad form electrode terminals 28 formed therein. A metal layer 36 of Cr is then formed by sputtering to entirely cover the wafer 50 including the electrode terminals 28. The sputtered Cr layer 36 has good affinity with the polyimide resin layer 32 to ensure good bonding therebetween.

Referring to FIG. 4(b), after forming a Cu thin film (not shown) on the metal layer 36 by sputtering, a patterned photoresist layer 52 is formed on the Cu thin film.

Referring to FIG. 4(c), electrolytic plating is carried out using the metal layer 36 and the Cu thin film as a current supply layer to form a patterned metal layer 34 of Cu having a greater thickness than the Cr metal layer 36 and acting as a conductor layer.

The Cu layer 34 and the Cr layer 36 can be etched with different etchants and the Cu layer 34 cannot be etched with an etchant which etches the Cr layer 36.

Referring to FIG. 4(d), a patterned photoresist layer 54 is formed to cover the Cu layer 34 and the Cr layer 36 while maintaining selected portions of the Cu layer 34 exposed through openings of the patterned photoresist layer 54, and thereafter, a wire bonding process is carried out to stand gold wires 56 on the selected exposed portions of the Cu layer 34 while bending the gold wires 56 with a capillary 58 generally used in wire bonding. The standing bent gold wires 56 are then cut at a selected height to form a core wire 22a. The core wires 22a of gold do not have a sufficient strength necessary for the connection terminals 22.

Referring to FIG. 5(a), electrolytic plating is carried out using the Cr metal layer 36 as a current supply layer to form a hard case 22b of a nickel-cobalt (Ni-Co) alloy entirely coating the core wires 22a to form wire form connection terminals 22 having a sufficient strength and a spring property.

Referring to FIG. 5(b), the photoresist layer 54 is removed and the thus-exposed portions of the Cr layer 36 are then removed by etching to form connection terminal pads 16 and extension wirings 26 on the wafer 50. The etching is carried by first removing the Cu thin film sputtered on the Cr layer 36 by etching with an etchant which etches Cu. Although the Cu layer 34 is also etched, the Cu thin film is much thinner than the Cu layer 34 and is completely removed with no substantial influence on the Cu layer 34. The Cr layer 36 is then removed by etching, which also causes no influence on the Cu layer 34, which is not etched by the etchant which etches the Cr layer 36.

Thus, a plurality of CSPs 12 having the connection terminal pads 16, the extension wirings 26 and the springy wire form connection terminals 22 are collectively formed in the wafer 50.

Figure 6:
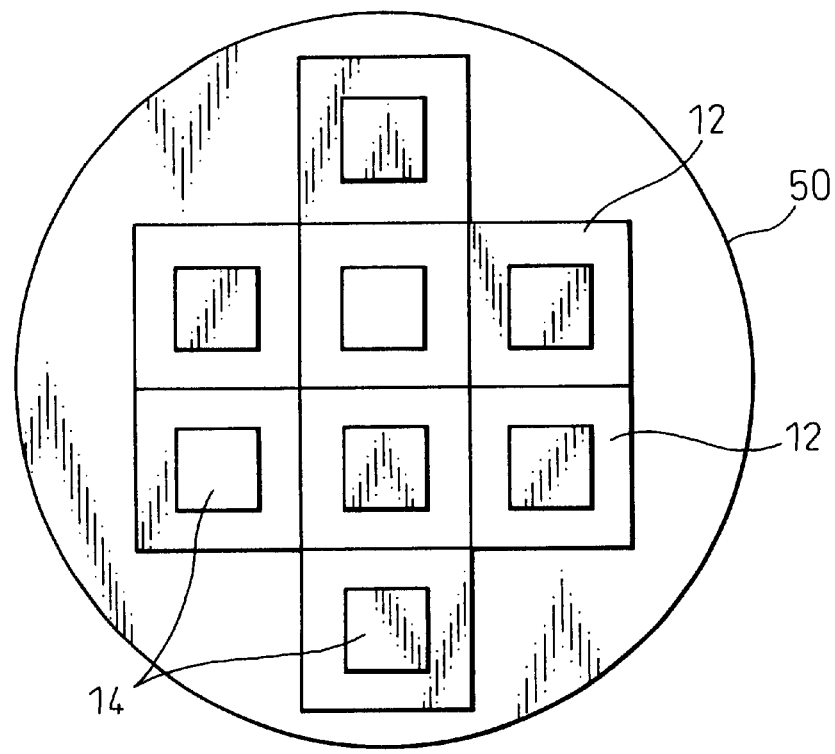
FIG. 6 is a plan view of a wafer having a plurality of semiconductor devices collectively formed thereon according to the present invention.

Then, referring to FIG. 6, BCs 14 are flip-chip bonded to the CSPs 12 in a selected portion. Flip-chip bonding essen-tially requires that the BCs 14 are precisely positioned with respect to the corresponding CSPs 12. This is easily achieved by the present inventive process, in which the CSPs 12 are formed and precisely positioned in a single wafer 50 and precise positioning of the BCs 14 with respect to the corresponding CSPs 12 is easily achieved by utilizing a positioning means of a wafer processing unit. Thus, the present invention advantageously ensures good mechanical and electrical connection between the CSPs 12 and the BCs 14 with precise mutual positioning.

The wafer 50 is then cut to provide separate CSPs 12 each having a BC 14 flip-chip bonded thereto, thereby completing a semiconductor device 10 shown in FIG. 1.

The BC 14 has a smooth upper surface opposite to an uneven surface including the electrode terminals 18 of the semiconductor chip 14a, and therefore, the assembly of the CSP 12 and the BC 14 can be easily transferred by vacuum adsorption of the smooth upper surface of the BC 14 during processing in spite of the provision of the springy wire form connection terminals 22 protruding upward.

Figure 7:
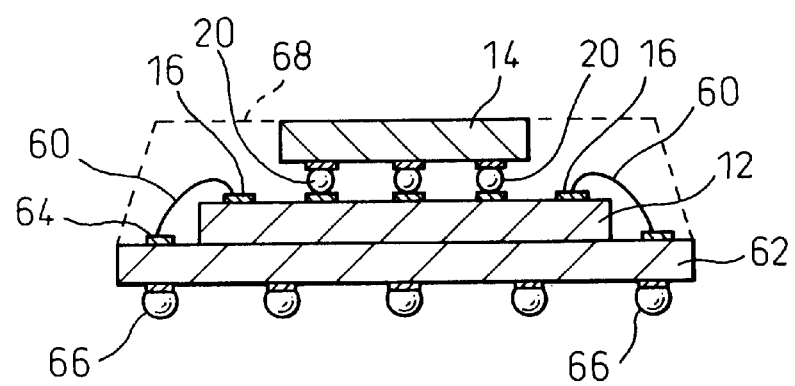
FIG. 7 is a cross-sectional view of a semiconductor device according to another embodiment of the present invention.

FIG. 7 is a vertical cross-sectional view of a semiconductor device according to another embodiment of the present invention, in which unlike the semiconductor device 10 shown in FIG. 1 no bent wire form connection terminals are provided, but conductor wires 60 connect connection terminals pads 16 of CSP 12 to connection terminal pads 64 of a substrate 62 having the pads 64 on one side on which a CSP 12 is disposed and solder balls 66 on the other side, the solder balls 66 being electrically connected to the pads 64. The assembly of the CSP 12, the BC 14 and the wires 60 is sealed or packaged with a sealing or packaging resin 68 on the substrate 62.

Figure 8:
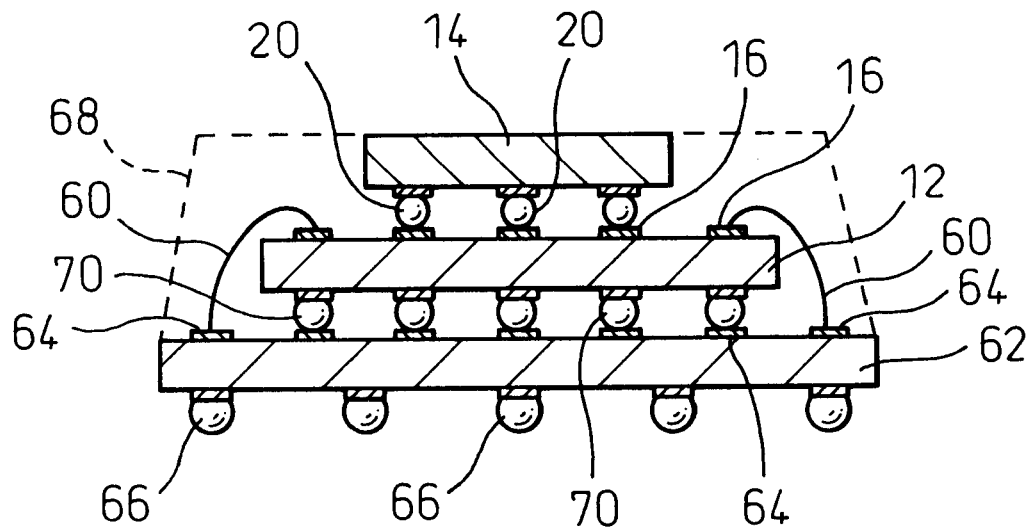
FIG. 8 is a cross-sectional view of a semiconductor device according to a third embodiment of the present invention.
Figure 9:
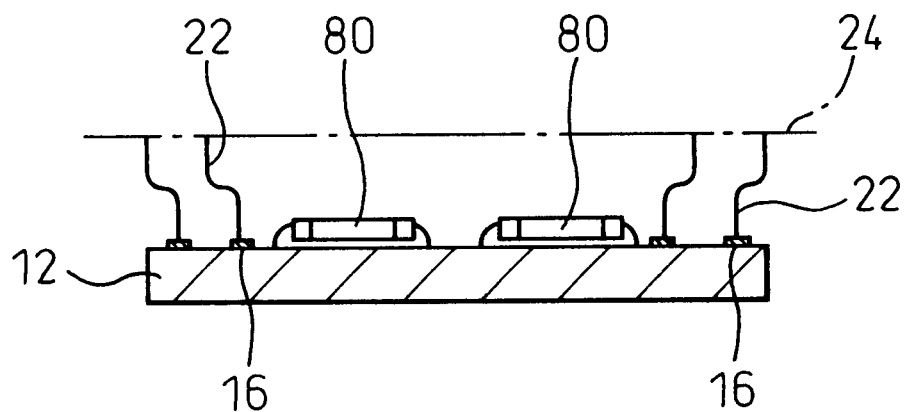
FIG. 9 is a cross-sectional view of a semiconductor device according to a fourth embodiment of the present invention.

FIG. 8 is a vertical cross-sectional view of a semiconductor device according to a third embodiment of the present invention, in which a CSP 12 includes a semiconductor chip 12a (FIG. 2) having an active surface provided with electrode terminals 18 and the opposite surface provided with connection terminal pads 16 which in part are electrically connected to solder balls 20 provided on an active surface of a BC 14 and the remaining part of the connection terminal pads 16 of the CSP 12 are electrically connected via conductor wires 60 to connection terminal pads 64 of a substrate 62. Solder balls 70 connect pad form electrode terminals 13 provided on the active surface of the CSP 12 to connection terminal pads 64 provided on the upper surface of the substrate 62. The connection terminal pads 64 are electrically connected to external connection terminals or solder balls 66 provided on the lower surface of the substrate 62. The assembly of the CSP 12, the BC 14 and the wires 60 is sealed or packaged with a sealing or packaging resin 68 on the substrate 62.

The semiconductor devices shown in FIGS. 7 and 8 are also advantageously produced by the present inventive process including forming a plurality of CSPs 12 on a single wafer 50 and flip-chip bonding BCs 12 to the corresponding CSPs 12, which ensures easy and precise mutual positioning of the CSPs 12 and the BCs 14 and facilitates transfer and handling of assemblies of the CSP 12 and the BC 14.

In a modified embodiment, the CSP 12 has a second CSP mounted thereon in place of the BC 14. The second CSP is smaller in area and in number of connection terminal pads than the CSP 12.

In another modification, the CSP 12 may be a ball grid array (BGA) type.

The BC 14 may be replaced with passive elements such as chip capacitors or chip resistors 80 having electrode terminals electrically connected to connection terminals of the CSP 12.

In a preferred embodiment of the present invention, flip-chip bonding of the first and second electronic parts may be performed by press-bonding using an anisotropic conductive film (ACF), instead of by reflowing solder balls, as described below.

Referring to FIG. 10(a), Au stud bumps 220 are formed on part of connection terminal pads 16 of a plurality of CSPs 12 formed in a single wafer 50 to provide connection terminals of the CSPs 12.

Referring to FIG. 10(b), springy wire form connection terminals 22 are formed on the remaining part of the connection terminal pads 16 in the same manner as hereinbefore described with reference to FIG. 4(d).

Referring to FIG. 10(c), an ACF 201 is temporarily pressed onto the Au stud bumps 220.

Referring to FIG. 10(d), a second electronic part or a BC 14 is placed on the ACF 201 and a pressure is applied to the BC 14 to press-bond the BC 14, the ACF 201 and the CSP 12 together, in which electrode terminals (not shown) of the BC and the Au stud bumps 220 are electrically connected through the ACF 201 in the portions in which anisotropic conductivity is established in the direction of the pressure application, thereby completing a semiconductor device 200 according to the present invention.

In a modification, press-bonding may be performed as follows.

Figure 11:
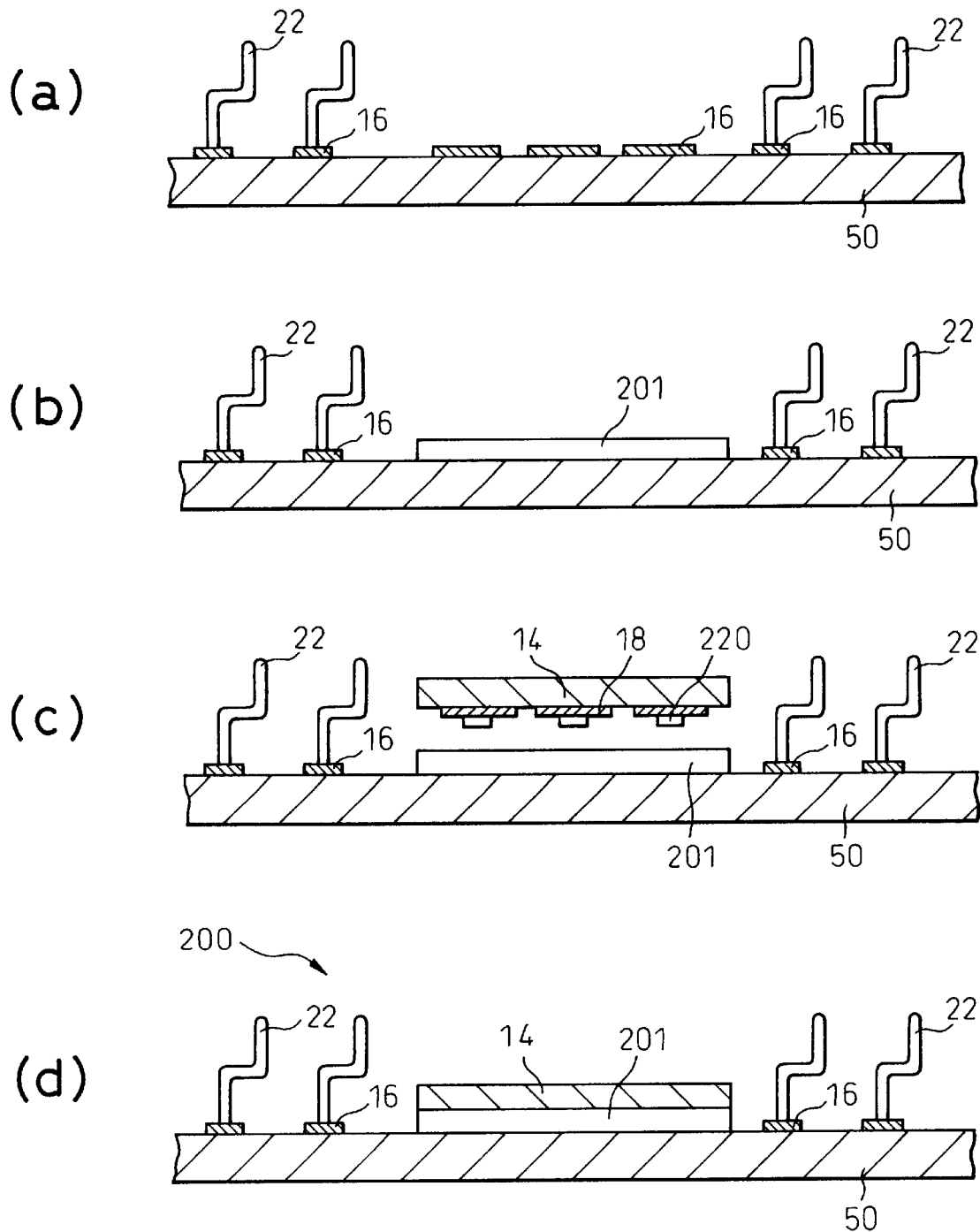
FIG. 11 is a cross-sectional view showing a process of producing a semiconductor device according to a modification of the process and device shown in FIG. 10.

Referring to FIG. 11(a), springy wire form connection terminals 22 are first formed on part of the connection terminal pads 16 of the wafer 50.

Referring to FIG. 11(b), an ACF 201 is temporarily press-bonded to the remaining part of the connection terminal pads 16.

Referring to FIG. 11(c), a BC 14 provided with connection terminal pads 18 having Au stud bumps 220 bonded thereto is placed up-side-down on the ACF 201.

Referring to FIG. 11(d), a pressure is applied to the BC 14 to press-bond the BC 14, the ACF 201 and the CSP 12 together, thereby completing a semiconductor device 200 according to the present invention.

In the above-mentioned embodiment, the use of an ACF advantageously avoids the environmental problems arising from the Pb contained in Sn—Pb or other Pb containing alloys of solder balls while ensuring easy and precise mutual positioning of the CSPs 12 and the BCs 14 as hereinbefore described for the other embodiments.

Figure 12:
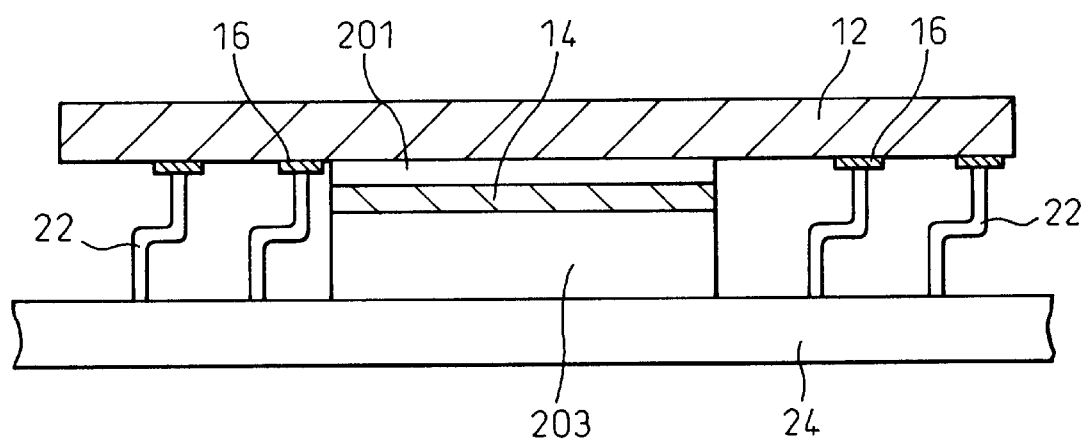
FIG. 12 is a cross-sectional view of a semiconductor device according to a sixth embodiment of the present invention.

A cushion may be also included in the semiconductor device using an ACF as shown in FIG. 12, in which a cushion 203 of silicone rubber, polyurethane or other resilient material has one side bonded to a motherboard 24 and the other side bonded to the BC 14 to absorb mechanical shocks. The cushion 203 may be bonded either to the back of the BC 14 or to the motherboard 24 before the BC 14 is mounted on, and bonded to, the motherboard 24.

It should be noted that a cushion 203 may be also suitably used for the same purpose in other embodiments disclosed herein that use no ACF 201.

The press-bonding may be performed by not using an ACF but by applying an ultrasonic vibration while heating either the BC 14 or the wafer 50, as described below.

Referring to FIG. 13(a), Au stud bumps 220 are formed on part of the connection terminal pads 16 of CSPs 12 collectively formed on a wafer 50.

Referring to FIG. 13(b), springy wire form connection terminals 22 are formed on the remaining part of the connection terminal pads 16 in the same manner as hereinbefore described with reference to FIG. 4(d).

Referring to FIG. 13(c), a bonding head 205 holding a BC 14 having connection terminal pads 18 of Au, Ag, Sn or Al is lowered until the pads 18 of the BC 14 are brought into close contact with the corresponding Au stud bumps 220 of the wafer 50.

Referring to FIG. 13(d), the bonding head 205 applies a pressure, an ultrasonic vibration and heat to the BC 14 to bond the pads 18 with the stud bumps 220 by fusion in an Au—Au, Au—Ag, Au—Sn or Au—Al system. The heat may otherwise be applied by heating the wafer 50 on a hot plate or the like. The connection terminal pads 18 are usually formed by plating Al electrode terminals of the BC 14 with Au, Ag or Sn and no further plating is necessary if the bonding is effected by an Au—Al system.

Referring to FIG. 13(e), the bonding head 205 is removed from the BC 14 to complete a semiconductor device 200 of the present invention.

The above-described process may be modified as follows.

Figure 14:
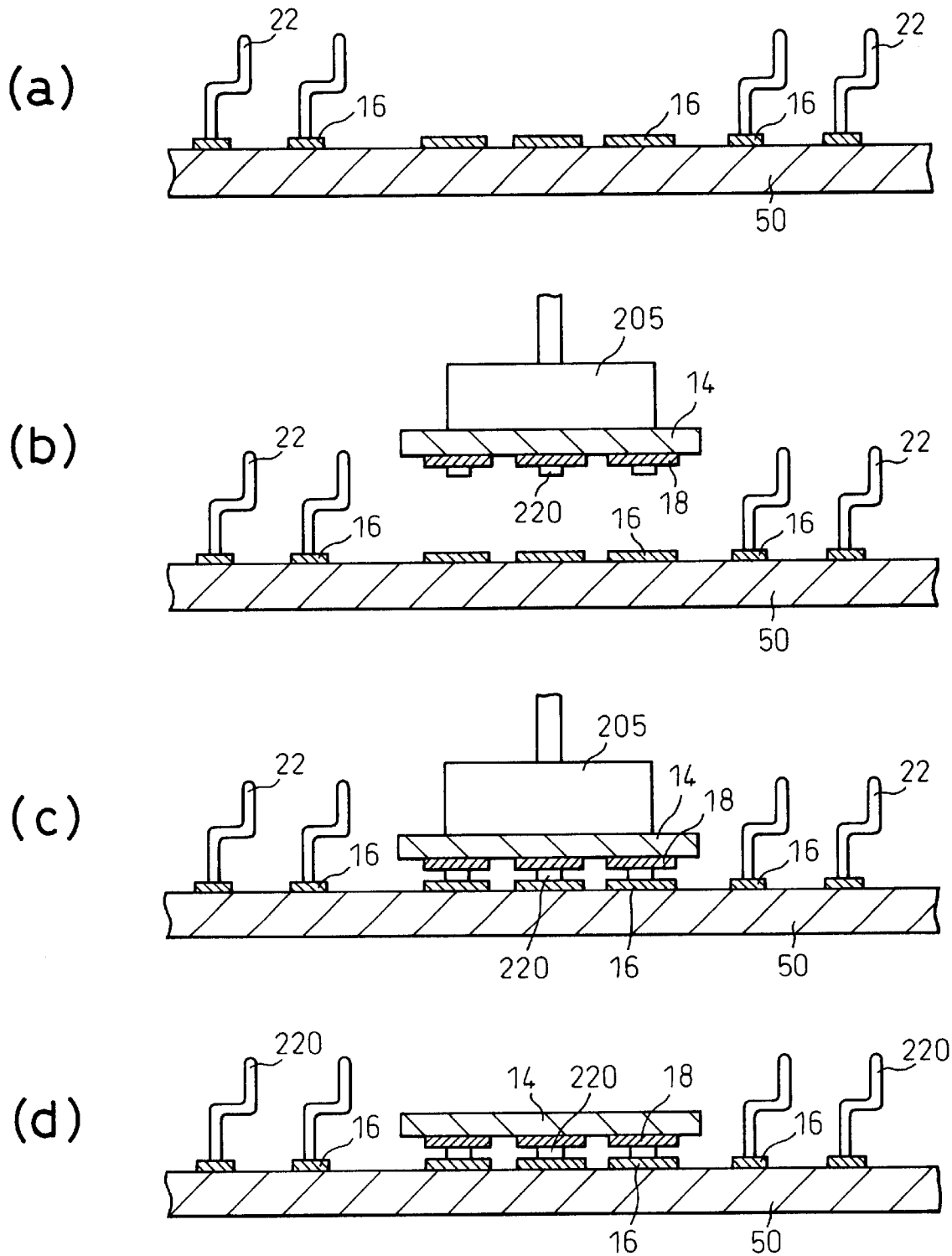
FIG. 14 is a cross-sectional view showing a process of producing a semiconductor device according to a modification of the process and device shown in FIG. 13.

Referring to FIG. 14(a), springy wire form connection terminals 22 of Au, Ag, Sn or Al are first formed on part of the connection terminal pads 16 of the wafer 50.

Referring to FIG. 14(b), a bonding head 205 attaching thereto a BC 14 provided with connection terminal pads 18 having Au stud bumps 220 bonded thereto is lowered until the Au stud bumps 220 of the BC 14 are brought into close contact with the corresponding pads 16 of the wafer 50.

Referring to FIG. 14(c), the bonding head 205 applies a pressure, an ultrasonic vibration and heat to the BC 14 to bond the pads 18 with the stud bumps 220 by fusion in an Au—Au, Au—Ag, Au—Sn or Au—Al system. The heat may be otherwise applied by heating the wafer 50 on a hot plate or the like. The connection terminal pads 16 usually have a plated coating of Au, Ag, Sn or Al.

Referring to FIG. 14(d), the bonding head 205 is removed from the BC 14 to complete a semiconductor device 200 of the present invention.

Figure 15:
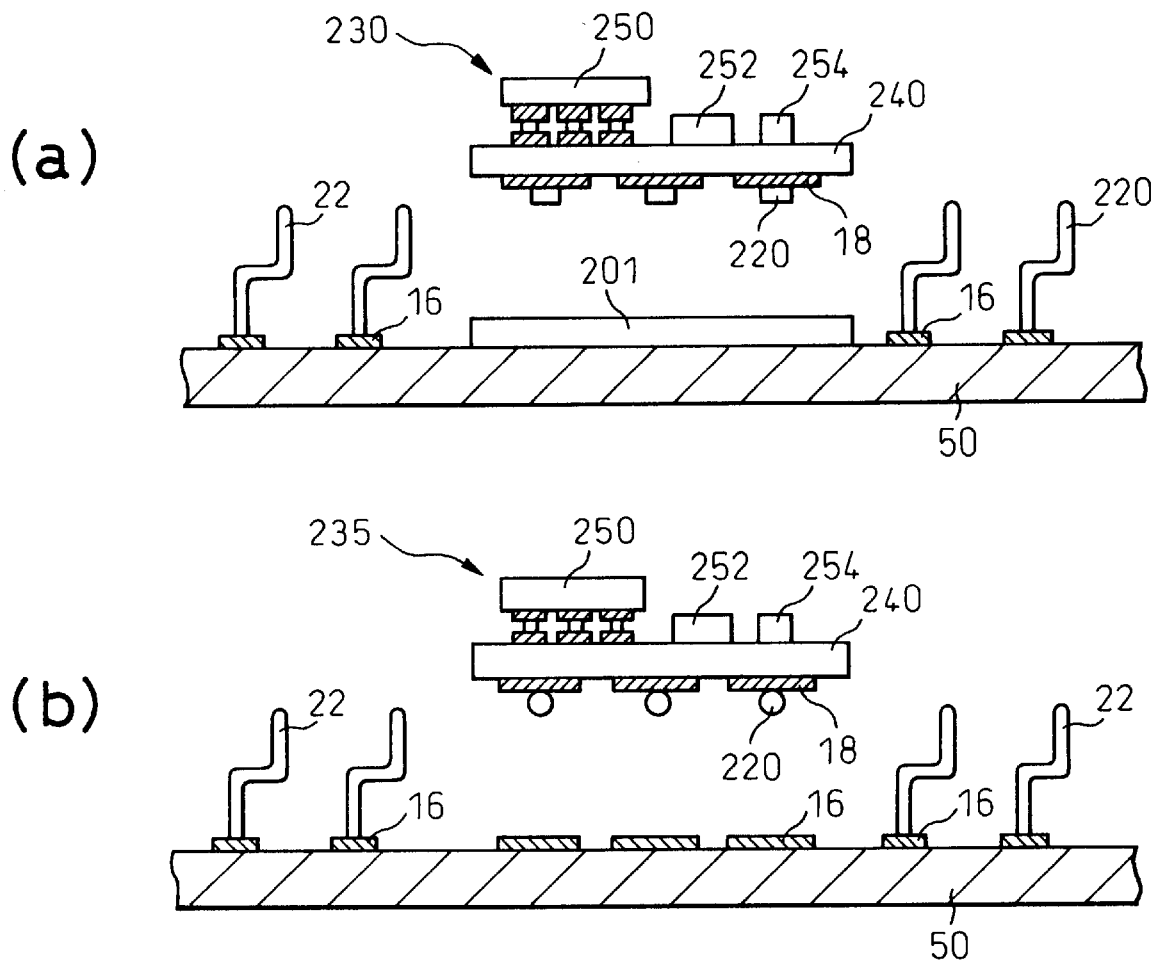
FIG. 15 is a cross-sectional view showing a process of producing a semiconductor device according to an eighth embodiment of the present invention.
Figure 16:
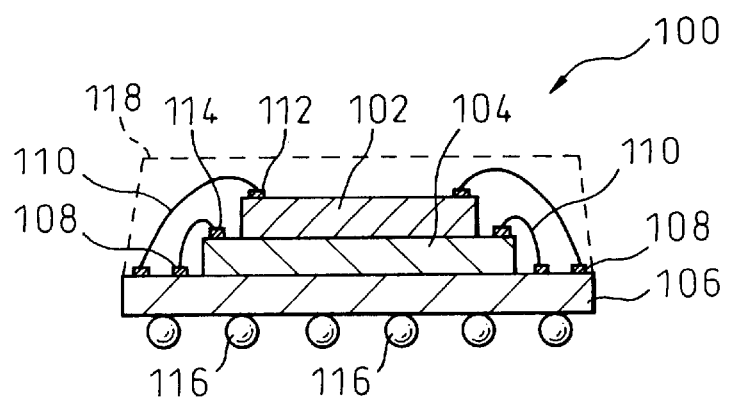
FIG. 16 is a cross-sectional view of a conventional semiconductor device.

In a further modification according to the present invention, the second electronic part mounted on the first electronic part or a CSP is a module composed of plural active and/or passive elements such as a bare chip, a chip capacitor, a chip resistor, etc., as shown in FIGS. 15(a) and 15(b).

FIG. 15(a) shows a module 230 composed of a substrate 240 having an upper side on which a BC 250, a chip capacitor 252 and a chip resistor 254 are mounted and a lower side provided with connection terminal pads 18 with stud bumps 220 bonded thereto. A wafer 50 has the same arrangement as shown in FIG. 11(b), in which an ACF 201 is temporarily press-bonded to the wafer 50 having connection terminal pads 16 with springy wire form connection terminals 22 bonded thereto. The module 230 is held on a bonding head (not shown) by vacuum absorption of the smooth back surface of the BC 250 and is press-bonded to the wafer 50 via an ACF 201 in the same process as described with reference to FIGS. 11(c) and 11(d).

FIG. 15(b) shows another module 235 having the same arrangement as the module 230 except that, instead of the stud bumps 220, solder balls 20 are bonded to connection terminal pads 18 on the lower side of a substrate 240. The module is held on a bonding head (not shown) by vacuum absorption of the smooth back surface of the BC 250, is lowered until the solder balls 20 are brought into close contact with the corresponding connection terminal pads 16 of the wafer 50, and is bonded to the wafer 50 by reflowing the solder balls 20.

According to the present invention, the BC 14 may be a thin chip preferably having a thickness of less than 200 μm, more preferably less than 100 μM, to facilitate reduction in thickness of the semiconductor device and/or to enable lamination of two or more BCs 14 within a limited thickness of the semiconductor device.

It will be readily recognized by a person skilled in the art that flip-chip bonding of the present invention is not limited to bonding BCs 14 with the CSPs 12 as formed collectively in a wafer but is also applied to bonding BCs 14, respectively, with separate CSPs 12 cut from the wafer.

As hereinabove described, the present invention provides a semiconductor device having a first electronic part and a second electronic part, the first electronic part being larger than the second electronic part in area and in the number of connection terminal pads including pad form electrode terminals, the first and second electronic parts are disposed one upon the other with respective pad forming surfaces facing each other, and external connection terminals or other connection terminals bonded to the connection terminal pads, in which the semiconductor device can be easily miniaturized and reduced in thickness. The present inventive semiconductor device is therefore advantageously applicable to portable telephones or other miniaturized apparatuses.

The present invention also provides a process for producing a semiconductor device of the present invention by collectively forming a plurality of the first electronic parts in a single wafer, which enables the semiconductor device to be manufactured with high precision and productivity.

What is claimed is:

1. A semiconductor device having a first electronic part and a second electronic part, the first electronic part being larger than the second electronic part in area and in the number of connection terminal pads including electrode terminals, and external connection terminals or other connection terminals bonded to the connection terminal pads, wherein:

the first and second electronic parts are disposed one upon the other with respective pad forming surfaces facing each other and are electrically connected to each other by flip-chip bonding; and springy wire form connection terminals stand on, and are bonded to, the connection terminal pads of the first electronic part other than those electrically connected to the connection terminal pads of the second electronic part, and the ends of the springy wire form connection terminals protrude above the second electronic part.

2. A semiconductor device according to claim 1, wherein the second electronic part includes a semiconductor chip.

3. A semiconductor device according to claim 1, wherein the first electronic part is a chip size package having substantially the same size as that of a semiconductor chip mounted thereon and the second electronic part is a bare chip having electrode terminals in a pad form.

4. A semiconductor device according to claim 1, wherein the first electronic part is a first chip size package having substantially the same size as that of a semiconductor chip mounted thereon and the second electronic part is a second chip size package having substantially the same size as that of a semiconductor chip mounted thereon.

5. A semiconductor device according to claim 1, wherein the connection terminal pads of at least one of the first electronic part and the second electronic part are electrically connected to electrode terminals of a semiconductor chip through an extension wiring formed on an electrode terminal forming surface of the semiconductor chip.

6. A semiconductor chip, wherein the connection terminal pads of at least one of the first electronic part and the second electronic part are composed of two layers of different metals etchable with different etchants.

7. A semiconductor device according to claim 1, wherein the springy wire form connection terminals are composed of a bent wire of gold or other metal having a metal coating plated thereon.

8. A semiconductor device according to claim 1, wherein the second electronic part is a passive element such as a chip capacitor or a chip resistor having electrode terminals electrically connected to the connection terminal pads of the first electronic part.

9. A semiconductor device according to claim 1, wherein the connection terminal pads of the first electronic part lie in a plane.

10. A semiconductor device according to claim 1, wherein the connection terminal pads of the first electronic part lie in a first plane and the connection terminal pads of the second electronic part lie in a second plane.

11. A semiconductor device according to claim 1, wherein the second electronic part is electronically connected only to the first electronic part.

* * * * *